(12) United States Patent
Wen et al.

(10) Patent No.: US 12,274,077 B2
(45) Date of Patent: Apr. 8, 2025

(54) METHOD OF FORMING SEMICONDUCTOR MEMORY DEVICE

(71) Applicant: TAIWAN SEMICONDUCTOR MANUFACTURING COMPANY, LTD., Hsinchu (TW)

(72) Inventors: Wei-Chih Wen, Hsinchu (TW); Yu-Wei Jiang, Hsinchu (TW); Han-Jong Chia, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 394 days.

(21) Appl. No.: 17/825,440

(22) Filed: May 26, 2022

(65) Prior Publication Data
US 2023/0389340 A1    Nov. 30, 2023

(51) Int. Cl.
*H10B 99/00* (2023.01)
*H01L 29/08* (2006.01)
*H10B 43/27* (2023.01)

(52) U.S. Cl.
CPC ......... *H10B 99/00* (2023.02); *H01L 29/0847* (2013.01); *H10B 43/27* (2023.02)

(58) Field of Classification Search
CPC ........ H10B 20/27–50; H10B 43/10–50; H10B 41/00–41
See application file for complete search history.

(56) References Cited

U.S. PATENT DOCUMENTS

| | | | |
|---|---|---|---|
| 2018/0090325 A1* | 3/2018 | Yoon | H01L 21/76865 |
| 2019/0312050 A1* | 10/2019 | Lai | H10B 43/27 |
| 2021/0074716 A1* | 3/2021 | Lim | H10B 41/50 |
| 2022/0115390 A1* | 4/2022 | Lee | H10B 43/40 |

* cited by examiner

*Primary Examiner* — Sonya McCall-Shepard
(74) *Attorney, Agent, or Firm* — Birch, Stewart, Kolasch & Birch, LLP

(57) ABSTRACT

A method of forming a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of source/drain trenches in the stack structure; conformally forming a barrier layer in the source/drain trenches, and then filling the source/drain trenches with a plurality of sacrificial segments; forming a protection layer over the stack structure to cover the barrier layer and the sacrificial segments; removing the sacrificial layers of the stack structure to form a plurality of spaces among the dielectric layers; forming a plurality of conductive layers in the spaces; sequentially removing the protection layer, the sacrificial segments and the barrier layer; and forming a plurality of memory structures in the source/drain trenches.

20 Claims, 15 Drawing Sheets

METHOD OF FORMING SEMICONDUCTOR MEMORY DEVICE

BACKGROUND

Currently, memory devices are widely used in various fields, such as cloud storage, medicine, transportation, mobile devices, etc. In order to provide memory devices with smaller dimension and higher storage capacity, manufacturers of memory devices have now shifted their focus on the development and production of 3-dimensional (3D) memory devices. Therefore, it is desirable to continuously improve the structure and manufacturing of the 3D memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
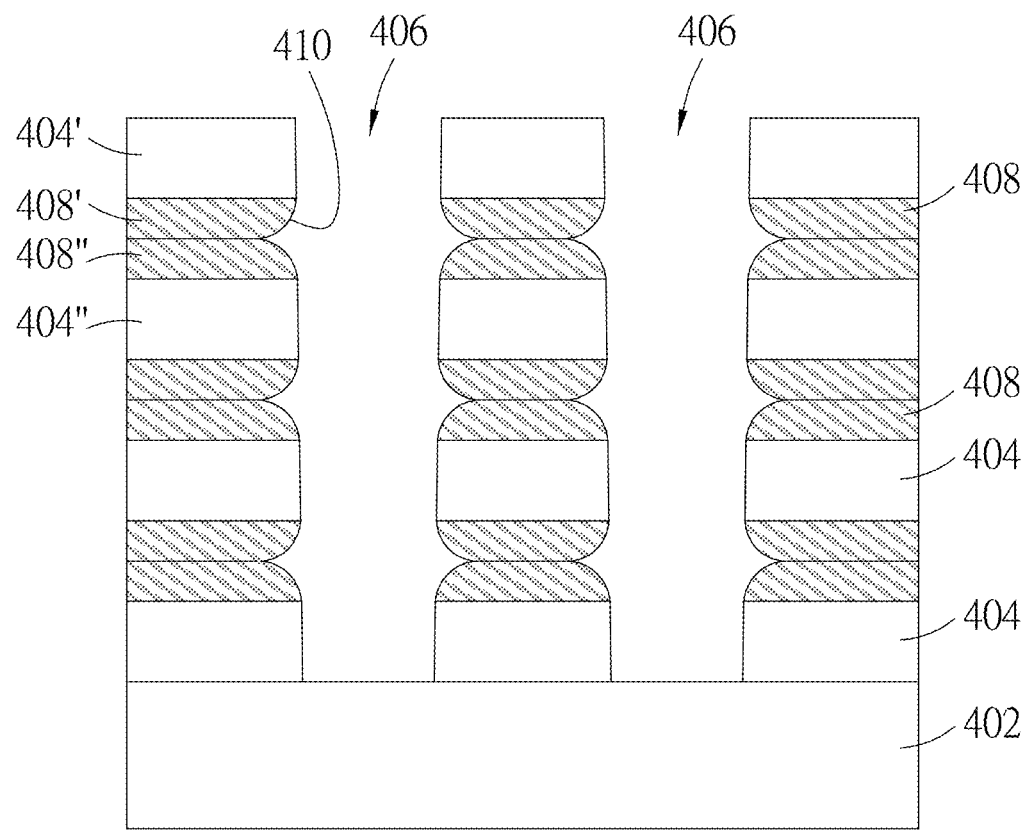
FIG. 1 is a schematic sectional view of an intermediate step of forming a semiconductor memory device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. In addition, the term "source/drain" may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1, in some embodiments of a method of forming a semiconductor memory device, a plurality of dielectric structures 404 are formed over a substrate 402, and a plurality of trenches 406 are formed in the dielectric structures 404. In addition, a plurality of conductors 408 are each formed between corresponding two of the dielectric structures 404. For example, as illustrated in FIG. 1, two of the conductors 408', 408" are respectively formed on corresponding two of the dielectric structures 404', 404", and are merged with each other, where a surface 410 defined by the conductors 408', 408" and exposed from a corresponding one of the trenches 406 may be uneven (e.g., may be in a bird's beak shape), which will adversely affect properties of memory devices that are subsequently formed in the trenches 406.

Figure 2:
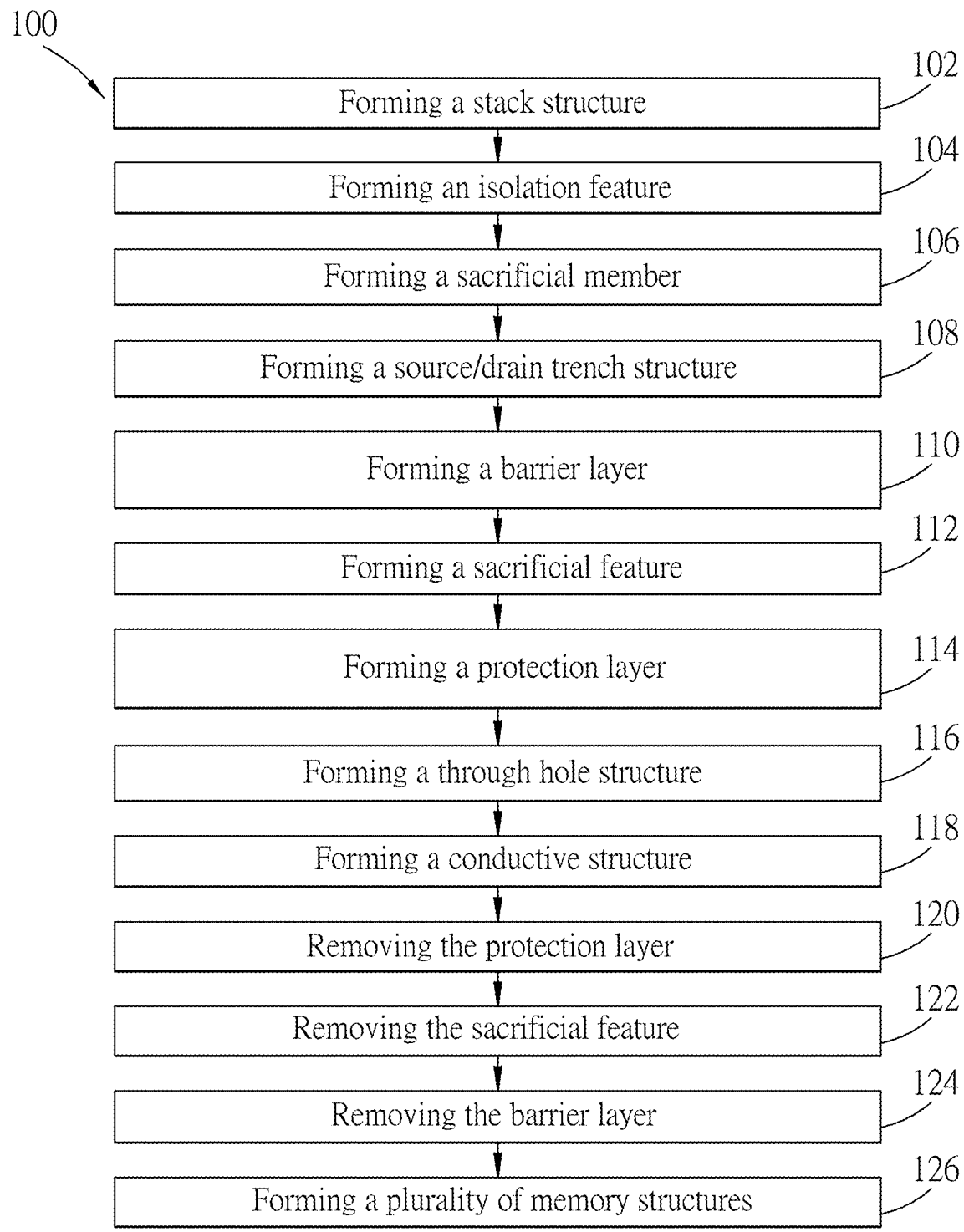
FIG. 2 is a flow chart illustrating a method forming a semiconductor memory device in accordance with some embodiments.

FIG. 2 illustrates a method 100 for forming a semiconductor memory device 240 (see FIG. 23) in accordance with some embodiments. FIGS. 3 to 24 are schematic views showing intermediate stages of the method 100 as depicted in FIG. 2. Additional steps which are not limited to those described in the method 100, can be provided before, after or during manufacturing of the semiconductor memory device 240, and some of the steps described herein may be replaced by other steps or be eliminated. Similarly, additional features may be present in the semiconductor memory device 240, and/or features present may be replaced or eliminated in additional embodiments.

Figure 3:
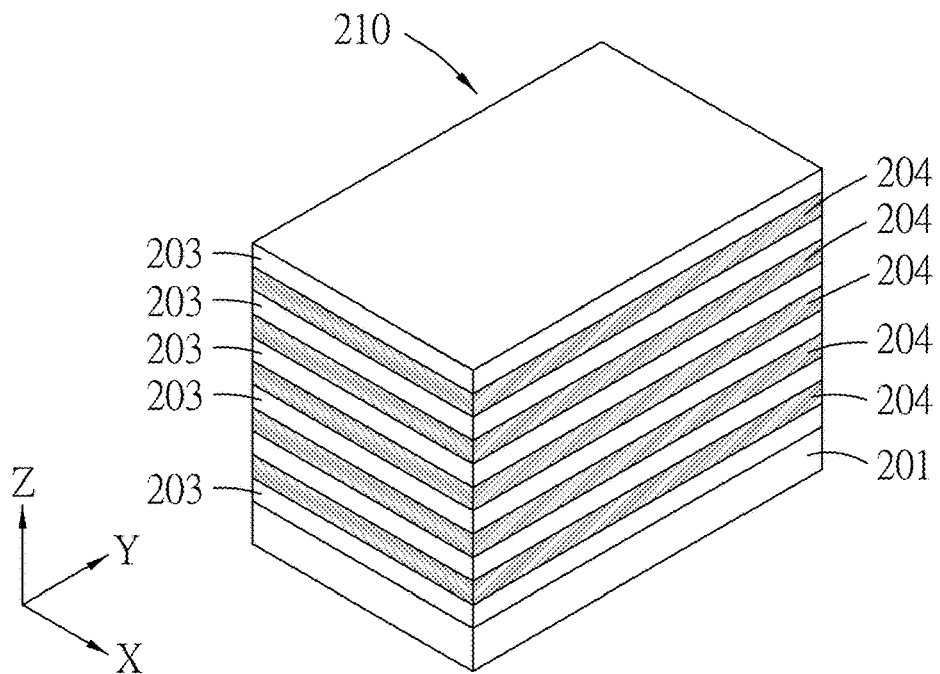
FIGS. 3 to 24 show intermediate steps of a method of forming a semiconductor memory device in accordance with some embodiments.

Referring to FIG. 2, in a step 102 of the method 100, a stack structure is formed on a substrate. FIG. 3 is a schematic perspective view showing that the stack structure 210 is formed on the substrate 201. In some embodiments, the substrate 201 may be a suitable substrate, such as an elemental semiconductor or a compound semiconductor. The elemental semiconductor may contain a single species of atom, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the composition of the compound semiconductor including the aforesaid elements may change from one ratio at one location to another ratio at another different location (i.e., the compound semiconductor may have a gradient composition). In some embodiments, the substrate 201 may be a semiconductor-on-insulator (SOI) substrate, such as silicon germanium-on-insulator (SGOI) substrate, or the like. In some embodiments, an SOI substrate may include an epitaxially grown semiconductor layer, such as Si, Ge, SiGe, any combination thereof, or the like, which is formed over an oxide layer. In some embodiments, the substrate 201 may be an inter-metal dielectric layer or an insulating layer of a back-end-of-line (BEOL) structure of an underlying semiconductor device (not shown).

Referring to FIG. 3, in some embodiments, the stack structure 210 includes a plurality of dielectric layers 203 and a plurality of sacrificial layers 204 that are alternatingly stacked on the substrate 201, for example, in a Z direction which may be substantially perpendicular to the substrate 201. In this embodiment, one of the dielectric layers 203 is first formed on the substrate 201, followed by forming one of the sacrificial layers 204 on such dielectric layer 203. However, in other embodiments, one of the sacrificial layers 204 may be first formed on the substrate 201, followed by forming one of the dielectric layers 203 on such sacrificial layers 204. In some embodiments, a top layer of the stack structure 210 is one of the dielectric layers 203.

In some embodiments, each of the dielectric layers 203 may be made of SiOx, SiCN, SiOC, other suitable materials, or any combination thereof. In some embodiments, the dielectric layers 203 may be made by CVD, ALD, PVD, other suitable materials, or any combination thereof. Each of the sacrificial layers 204 may be made of $Si_3N_4$, amorphous silicon, other suitable materials, or any combination thereof. In some embodiments, the sacrificial layers 204 may be made by CVD, ALD, PVD, other suitable techniques, or any combination thereof. In some embodiments, the sacrificial layers 204 are made of a material that has a high etch selectivity relative to the dielectric layers 203 (i.e., a suitable etchant may readily etch the sacrificial layers 204 while leaving the dielectric layers 203 substantially unetched).

Figure 4:
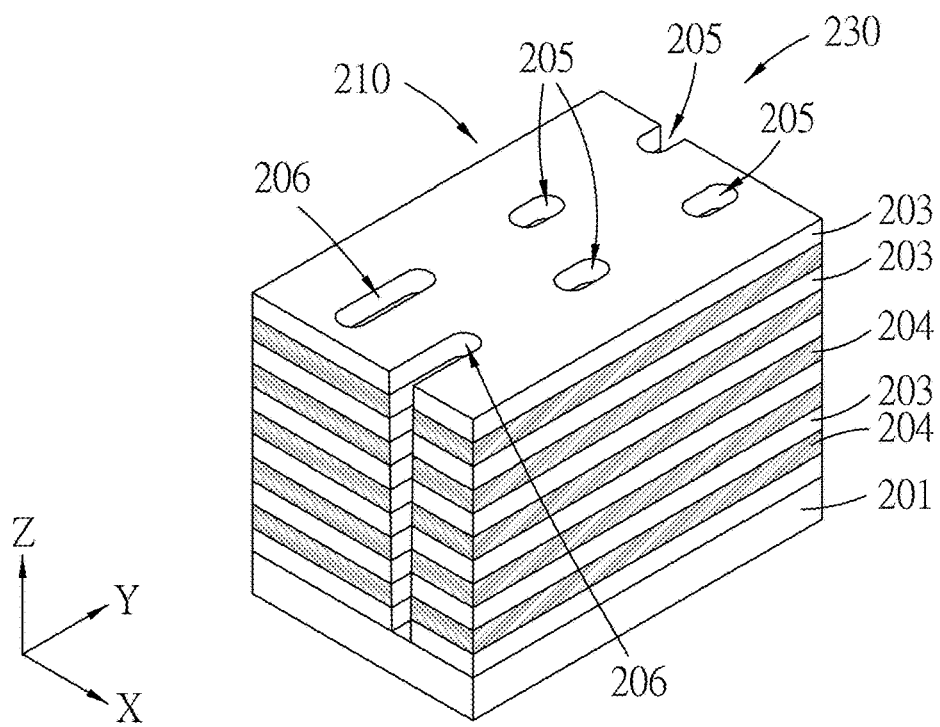

Referring to FIG. 2, in a step 104 of the method 100, an isolation feature is formed. Referring to FIG. 4, in some embodiments, the stack structure 210 may be etched to form an isolation trench structure 230 which may include a plurality of first isolation trenches 205 and a plurality of second isolation trenches 206. The stack structure 210 may be etched using a suitable technique, such as anisotropic dry etch or the like, with a suitable etchant, such as $CF_4$, $CHF_3$, $CH_2F_2$, Ar, $N_2$, $O_2$, He, or any combination thereof. As schematically shown in FIG. 4, two first isolation trenches 205 and one second isolation trench 206 in the right row of FIG. 4 are substantially aligned with one another in a Y direction which is substantially parallel to the substrate 201 and is substantially perpendicular to the Z direction. However, in other embodiments, the first isolation trenches 205 and the second isolation trench 206 in the right row of FIG. 5 may be slightly misaligned with one another in the Y direction. Similarly, two first isolation trenches 205 and one second isolation trench 206 in the left row of FIG. 4 may be substantially aligned or slightly misaligned with one another in the Y direction. When viewing from above, each of the first isolation trenches 205 and the second isolation trenches 206 may be substantially rectangular and may have four round corners, but other suitable shapes are also within the scope of this disclosure. In some embodiments, each of the second isolation trenches 206 may have a length in the Y direction greater than that of each of the first isolation trenches 205. Each of the first isolation trenches 205 and the second isolation trenches 206 may penetrate the stack structure 210. The numbers and arrangements of the first isolation trenches 205 and the the second isolation trenches 206 may be changed according to practical requirements.

Figure 5:
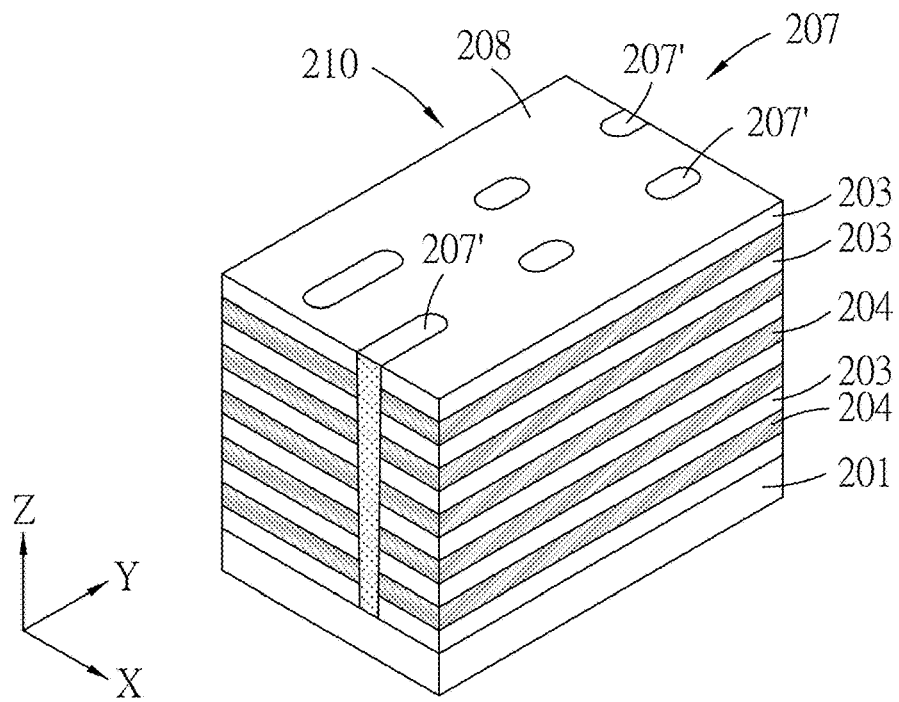

Then, referring to FIG. 5, a suitable material, such as an electrically insulating material, including SiOx, SiCN, SiOC, or any combination thereof may be deposited to fill the first isolation trenches 205 and the second isolation trenches 206 of the isolation trench structure 230 (see FIG. 4) and may also be deposited on a top surface 208 of the stack structure 210, followed by removing the material on the top surface 208 using chemical mechanical planarization (CMP), etch back, other suitable techniques, or any combination thereof, so as to form an isolation feature 207 filling the isolation trench structure 230. In some embodiments, the isolation feature 207 includes a plurality of isolation segments 207' that respectively fill the first isolation trenches 205 and the second isolation trenches 206 of the isolation trench structure 230 (see FIG. 4). In some embodiments, the step of removing the material on the top surface 208 may also partially remove a topmost dielectric layer 203 (i.e., the topmost layer of the stack structure 210); in other embodiments, such removing step may also entirely remove the topmost dielectric layer 203; and in still other embodiments, such removing step may not etch the topmost dielectric layer 203.

Figure 6:
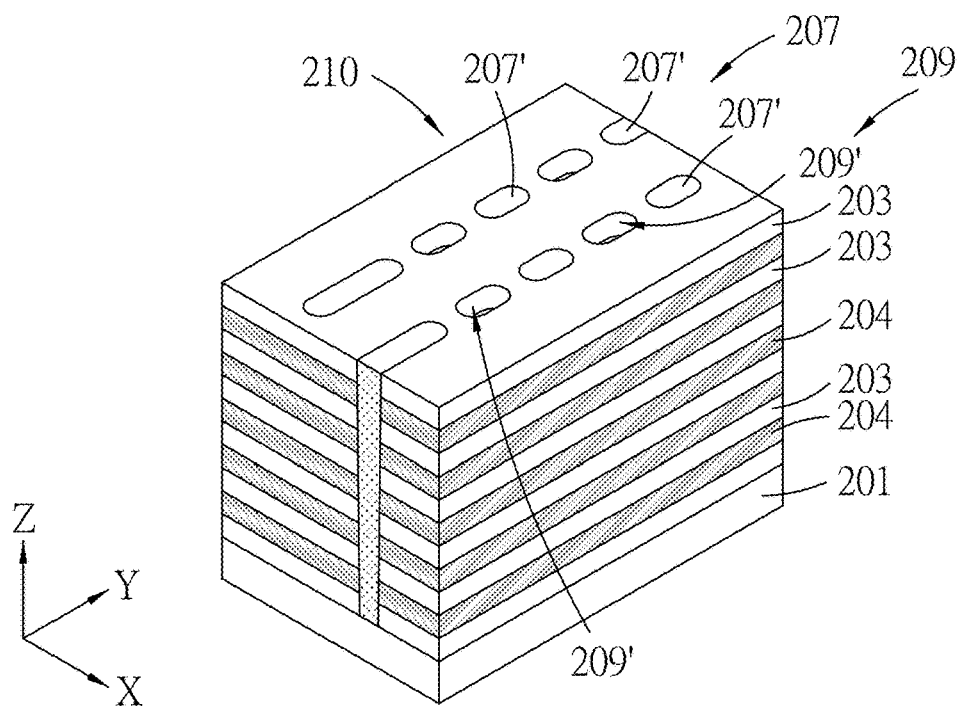

Referring to FIG. 2, in a step 106 of the method 100, a sacrificial member is formed. Referring to FIG. 6, in some embodiments, the stack structure 210 may be etched to form a channel trench structure 209 which may include a plurality of channel trenches 209'. As shown in FIG. 6, each of the channel trenches 209' may be disposed between corresponding adjacent two of the isolation segments 207' in the Y direction. In some embodiments, each of the channel trenches 209' may be slightly misaligned with the corresponding adjacent two of the isolation segments 207' in the Y direction, and each of the channel trenches 209' may be slightly closer to one of the corresponding adjacent two of the isolation segments 207'. In some embodiments, a length of each of the channel trenches 209' in the Y direction may be greater than the width of the channel trench 209' in an X direction, which may be substantially parallel to the substrate 201 and may be substantially perpendicular to the Y direction and the Z direction. In some embodiments, the stack structure 210 may be etched using a suitable technique, such as anisotropic dry etch or the like, with a suitable etchant, such as $CF_4$, $CHF_3$, $CH_2F_2$, Ar, $N_2$, $O_2$, He, or any combination thereof. Each of the channel trenches 209' may penetrate the stack structure 210.

Figure 7:
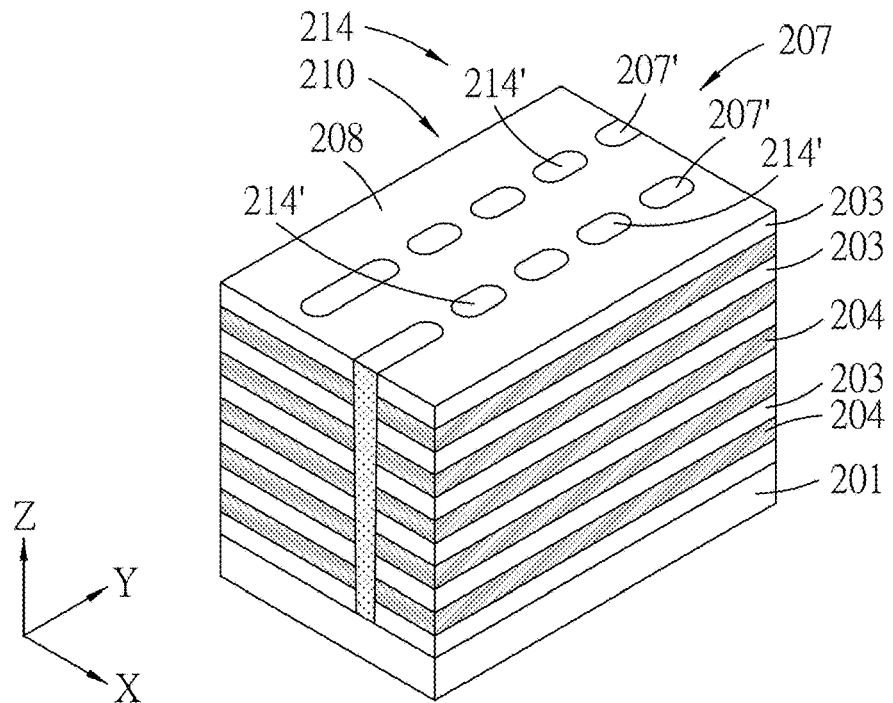

Then, referring to FIG. 7, a suitable material, such as $Si_3N_4$, amorphous silicon, or any combination thereof may be deposited to fill the channel trenches 209' of the channel trench structure 209 (see FIG. 6) and may also be deposited on the top surface 208 of the stack structure 210, followed by removing the material on the top surface 208 using a suitable technique, such as CMP, etch back, or any combination thereof to form the sacrificial member 214 filling the channel trench structure 209 (see FIG. 6). In some embodiments, the sacrificial member 214 includes a plurality of sacrificial portions 214' that respectively fill the channel trenches 209' of the channel trench structure 209 (see FIG. 6). In this embodiment, the step of removing the material on the top surface 208 may entirely remove the topmost dielectric layer 203. However, in other embodiments, only a part of the topmost dielectric layer 203 is removed; and in still other embodiments, the topmost dielectric layer 203 is not etched or removed.

Figure 8:
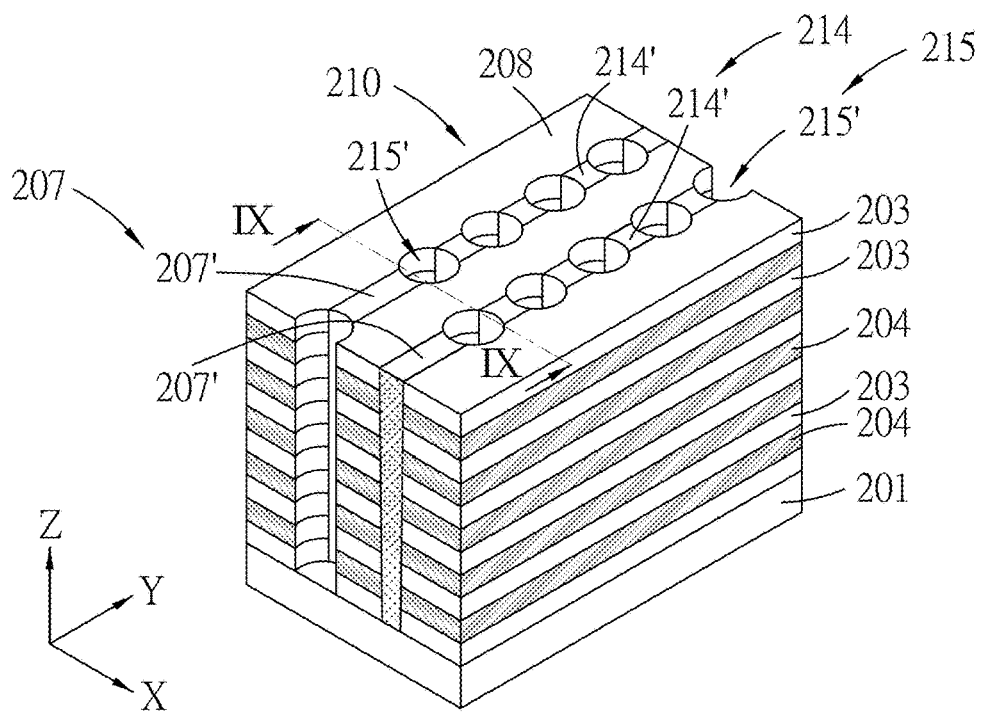
Figure 9:
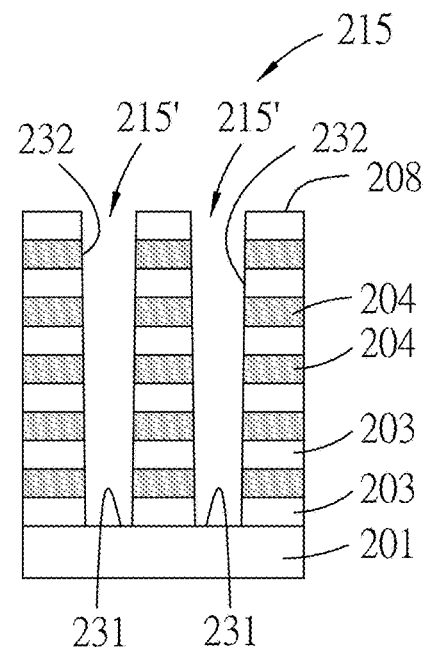

Referring to FIG. 2, in a step 108 of the method 100, a source/drain trench structure is formed. As shown in FIGS. 7 to 9, where FIG. 9 is a sectional view taken from line IX-IX of FIG. 8, the stack structure 210, the sacrificial member 214 and the isolation feature 207 may be etched to form the source/drain trench structure 215 which may include a plurality of source/drain trenches 215', in accordance with some embodiments of this disclosure. In some embodiments, each of the source/drain trenches 215' may be defined by a corresponding one of bottom walls 231 and a corresponding one of a side walls 232 of the stack structure 210. As shown in FIGS. 8 and 9, each of the source/drain trenches 215' may be formed by etching the stack structure 210, a portion of a corresponding one of the isolation segments 207' and a portion of a corresponding one of the sacrificial portions 214', and may be disposed between the corresponding one of the isolation segments 207' and the corresponding one of the sacrificial portions 214'. In some embodiments, each of the source/drain trenches 215' may be slightly misaligned with the corresponding one of the isolation segments 207' and the corresponding one of the sacrificial portions 214' in the Y direction. In this embodiment, as shown in FIG. 8, each of the source/drain trenches 215' is substantially circular in shape when viewed from above; but, in other embodiments, each of the source/drain trenches 215' may be oval, rectangular or have other suitable shapes when viewed from above. In some embodiments, the stack structure 210, the corresponding one of the sacrificial portions 214' and the corresponding one of the isolation segments 207' may be etched using a suitable technique, such as anisotropic dry etch or the like, with a suitable etchant, such as $CF_4$, $CHF_3$, $CH_2F_2$, Ar, $N_2$, $O_2$, He, or any combination thereof. Each of the source/drain trenches 215' may penetrate the stack structure 210, the corresponding one of the sacrificial portions 214' and the corresponding one of the isolation segments 207'.

Figure 10:
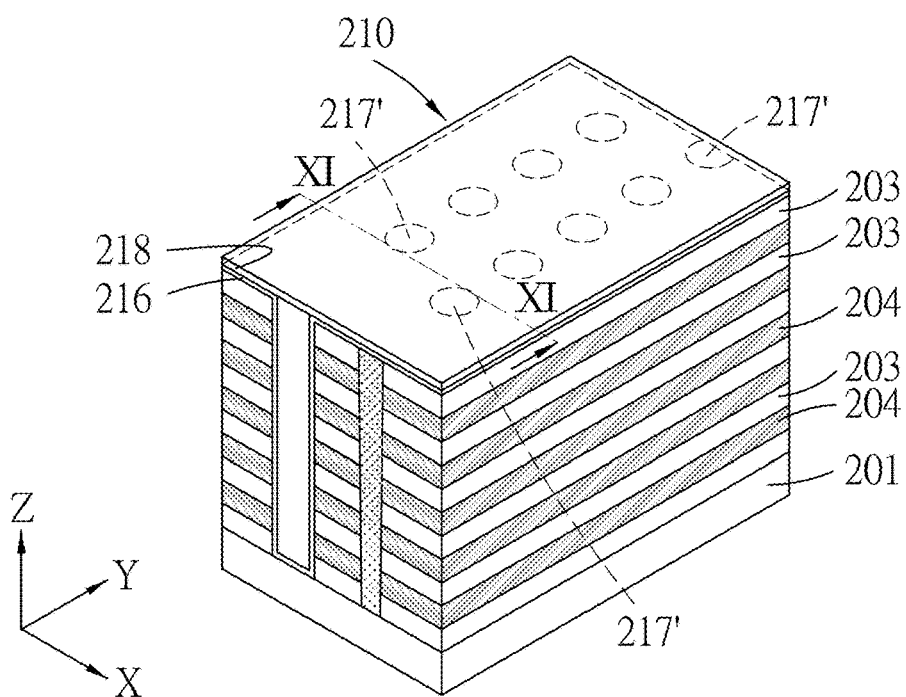
Figure 11:
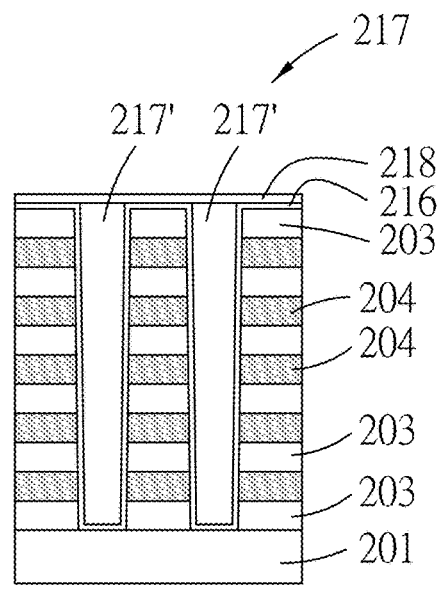

Referring to FIG. 2, in a step 110 of the method 100, a barrier layer is formed. Referring to FIGS. 9 to 11, where FIG. 11 is a sectional view taken from line XI-XI of FIG. 10, the barrier layer 216 may be conformally formed in the source/drain trenches 215' of the source/drain trench structure 215, on the bottom walls 231 of the stack structure 210, on the side walls 232 of the stack structure 210, and on the top surface 208 of the stack structure 210, in accordance with some embodiments of this disclosure. In some embodiments, the barrier layer 216 only partially fills the source/drain trenches 215' of the source/drain trench structure 215, instead of completely filling the same. In some embodiments, the barrier layer 216 may be made by CVD, ALD, PVD, other suitable techniques, or any combination thereof.

Referring to FIG. 2, in a step 112 of the method 100, a sacrificial feature is formed. Referring to FIGS. 8 to 11, in some embodiments, the sacrificial feature 217 may be formed in the source/drain trench structure 215, where the sacrificial feature 217 may include a plurality of sacrificial segments 217' that are respectively formed in the source/drain trenches 215'. In some embodiments, the sacrificial feature 217 may be made of a nitride-based material (e.g., silicon nitride, etc.), other suitable materials, or any combination thereof. In some embodiments, the sacrificial feature 217 may be made by CVD, ALD, PVD, other suitable techniques, or any combination thereof.

Referring to FIG. 2, in a step 114 of the method 100, a protection layer is formed. Referring to FIGS. 8 to 11, in some embodiments, the protection layer 218 is formed over and covers the barrier layer 216 and the sacrificial segments 217' of the sacrificial feature 217. In some embodiments, the protection layer 218 may be made of SiOx, SiCN, SiOC, other suitable materials, or any combination thereof. In some embodiments, the protection layer 218 may be made by CVD, ALD, PVD, other suitable materials, or any combination thereof.

Figure 12:
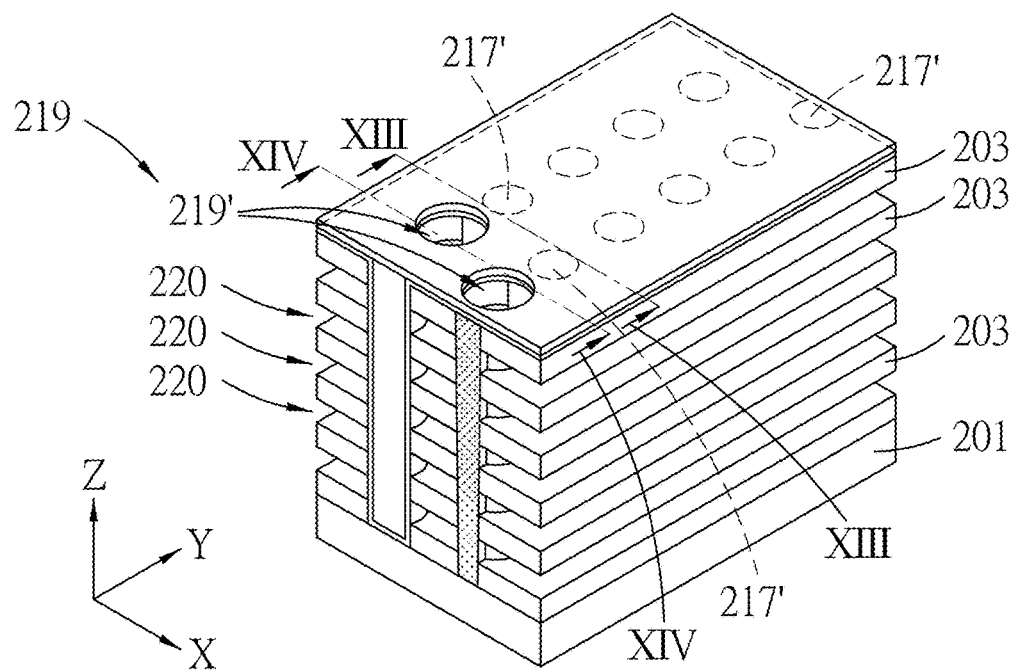
Figure 14:
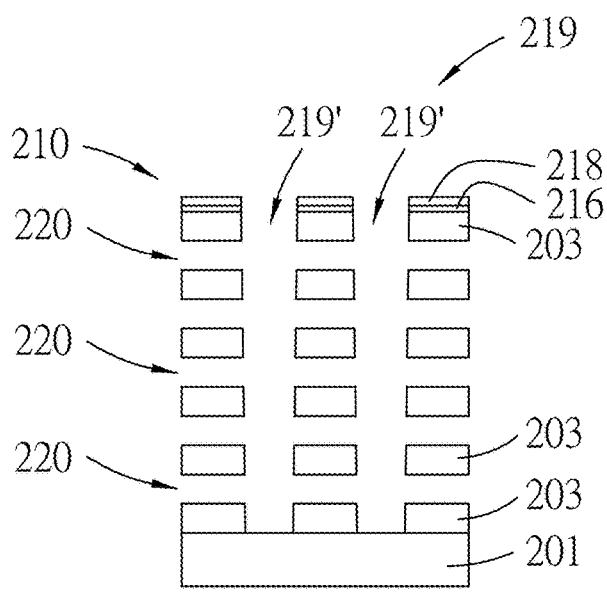

Referring to FIG. 2, in a step 116 of the method 100, a through hole structure is formed. Referring to FIGS. 12 and 14, where FIG. 14 is a sectional view taken from line XIV-XIV of FIG. 12, the through hole structure 219 includes a plurality of through holes 219' (two of which are schematically shown in FIG. 12), in accordance with some embodiments of this disclosure. In some embodiments, the protection layer 218, the stack structure 210 and two of the isolation segments 207' filling the second isolation trenches 206 shown in FIG. 4 (see the two isolation segments 207' in FIG. 8) may be etched to form the through holes 219'. As shown in FIG. 12, each of the through holes 219' may be formed by etching the protection layer 218, the stack structure 210 and a portion of a corresponding one of the isolation segments 207' to allow the sacrificial layers 204 of the stack structure 210 to be exposed to the ambient environment through the through holes 219', thereby facilitating removal of the sacrificial layers 204 and growth of a conductive structure 221 (see FIGS. 15 and 16), both of which will be described in detail hereinafter. In some embodiments, each of the through holes 219' may be slightly misaligned with the corresponding sacrificial segment 217' in the Y direction. In this embodiment, each of the through holes 219' is substantially circular in shape when viewed from above, but, in other embodiments, each of the source/drain trenches 215' may be oval, rectangular or have other suitable shapes when viewed from above. In some embodiments, a maximum width of each of the through holes 219' in the X direction may be greater than the width of the corresponding isolation segment 207' in the X direction to ensure that the sacrificial layers 204 of the stack structure 210 are exposed to the ambient environment through the through holes 219'. The stack structure 210 and the corresponding isolation segment 207' may be etched using a suitable technique, such as anisotropic dry etch or the like, with a suitable etchant, such as $CF_4$, $CHF_3$, $CH_2F_2$, Ar, $N_2$, $O_2$, He, or any combination thereof. Each of the through holes 219' may penetrate the protection layer 218, the stack structure 210 and the corresponding isolation segment 207'.

Figure 13:
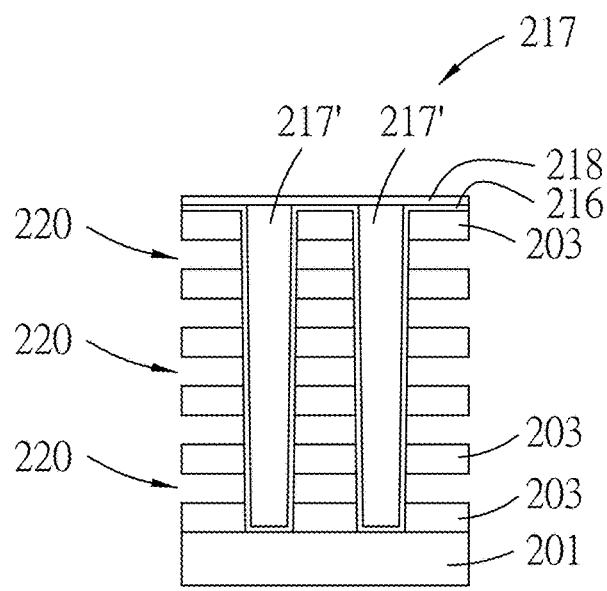

Referring to FIG. 2, in a step 118 of the method 100, the conductive structure is formed. Referring to FIGS. 10 to 14, where FIG. 13 is a sectional view taken from line XIII-XIII of FIG. 12, the sacrificial layers 204 of the stack structure 210 are removed. In some embodiments, the device is treated with a suitable etchant, such as phosphoric acid, and a portion of the etchant may enter the through holes 219' of the through hole structure 219 to etch away the sacrificial layers 204 of the stack structure 210 so as to form a plurality of spaces 220, while leaving the protection layer 218, the barrier layer 216, and the dielectric layer 203 of the stack structure 210 substantially unetched or slightly etched. The spaces 220 are spatially communicated with the through hole structure 219. In some embodiments, since the sacrificial segments 217' of the sacrificial feature 217 are covered by the barrier layer 216 and the protection layer 218, they are not etched during the process of removing the sacrificial layers 204 of the stack structure 210. In some embodiments, the protection layer 218 may have a thickness ranging from about 20 Å to about 1000 Å, from about 20 Å to about 50 Å, from about 50 Å to about 100 Å, from about 100 Å to about 200 Å, from about 200 Å to about 300 Å, from about 300 Å to about 400 Å, from about 400 Å to about 500 Å, from about 500 Å to about 600 Å, from about 600 Å to about 700 Å, from about 700 Å to about 800 Å, from about 800 Å to about 900 Å, from about 900 Å to about 1000 Å, or may be in other suitable ranges. In some embodiments, if the thickness of the protection layer 218 is too low, such as lower than about 20 Å, the protection layer 218 may not be able to protect the sacrificial feature 217 during the process of removing the sacrificial layers 204. In some embodiments, if the thickness of the protection layer 218 is too high, such as higher than about 1000 Å, the barrier layer 216 may be damaged in a subsequent process of removing the protection layer 218 since a longer etch time may be needed to remove the thick protection layer 218. In some embodiments, the sacrificial layers 204 are made of a material that has high etching selectivity relative to the barrier layer 216, such that when the sacrificial layers 204 is being removed, the barrier layer 216 is only slightly etched or substantially unetched. In some embodiments, the barrier layer 216 may be made of doped or undoped amorphous silicon, other suitable materials, or any combination thereof.

Figure 15:
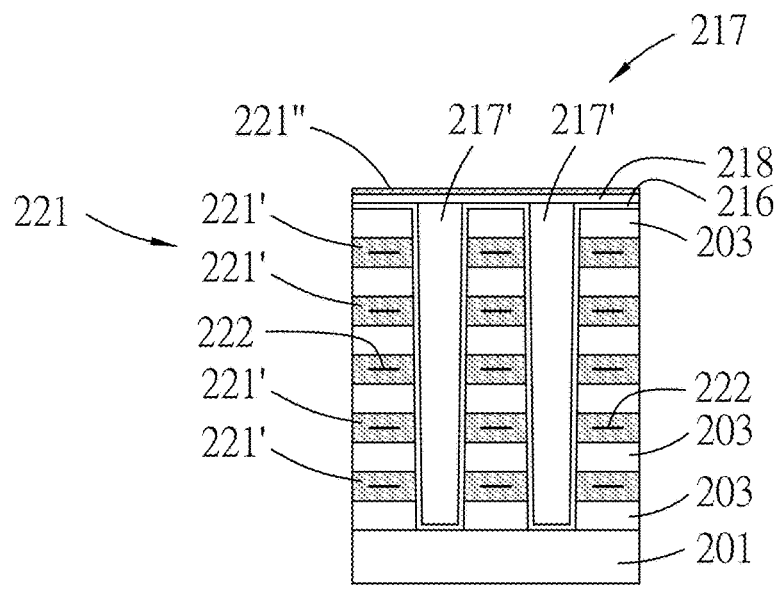
Figure 16:
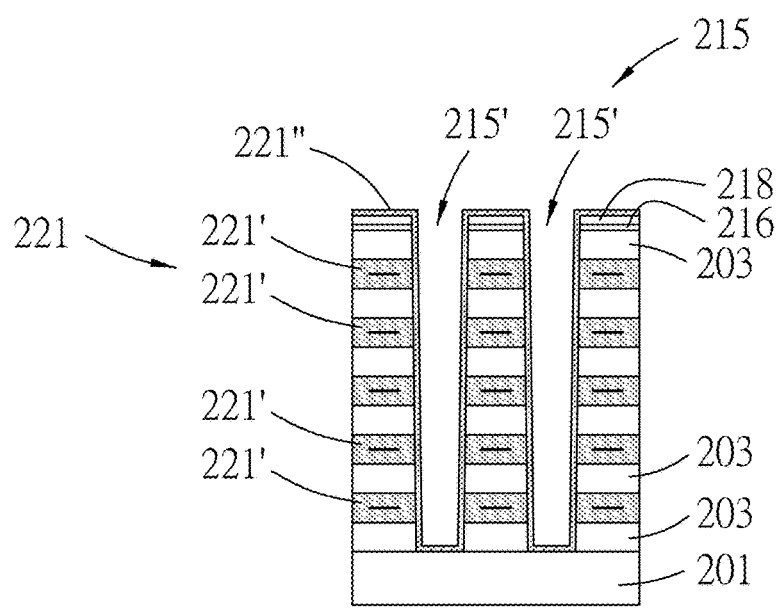

Then, referring to FIGS. 15 and 16, in some embodiments, the conductive structure 221 may be formed by subjecting the device to be in contact with a suitable precursor material. The precursor material enters the spaces 220 through the through holes 219' of the through hole structure 219 so as to form a plurality of conductive layers 221' respectively filling the spaces 219. In some embodiments, a conductive portion 221" is also formed from the precursor material, and may cover the protection layer 218 and may be formed in the through holes 219' of the through hole structure 219. In other words, the conductive structure 221 includes the conductive layers 221' and the conductive portion 221", and may be made of polysilicon (doped or undoped), silicide (TiSi, CoSi, SiGe or the like), oxide semiconductor (InZnO, InGaZnO or the like), metal (Al, Cu, W, Ti, Co, Ni, Ru, TiN, TaN, TaAlN or the like), other suitable materials, or any combination thereof. The conductive structure 221 may be formed using a suitable technique, such as CVD, ALD, electroplating, electroless plating, or any combination thereof. Referring to FIG. 15, during the formation of the conductive layers 221', the precursor material may be formed on the dielectric layers 203 and on the barrier layer 216 to thereby forming the conductive layers 221'. Referring further to FIG. 13, since the spaces 220 are surrounded by the barrier layer 216 which allows the precursor material to be formed thereon, formation of the conductive layers 221' with a bird's beak shape may be prevented. In some embodiments, each of the conductive layers 221' may be formed with a seam 222 therein.

Figure 17:
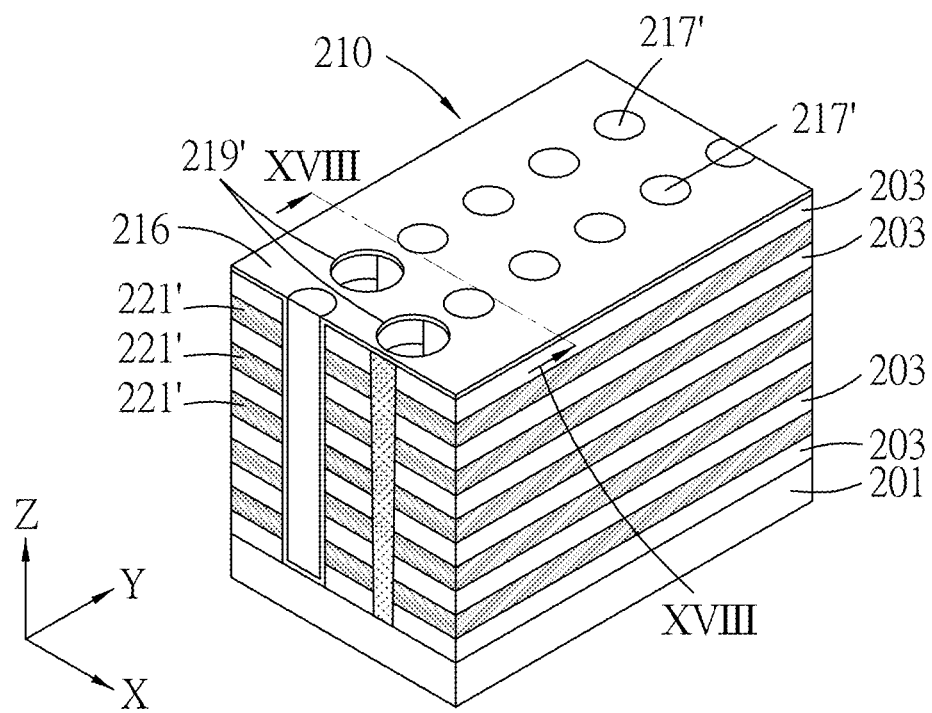
Figure 18:
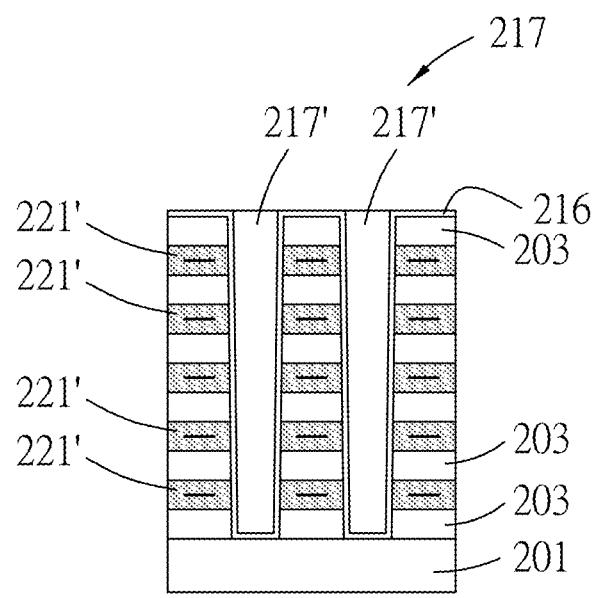

Referring to FIG. 2, in a step 120 of the method 100, the protection layer is removed. Referring to FIGS. 17 and 18, where FIG. 18 is a sectional view taken from line XVIII-XVIII of FIG. 17, the protection layer 218 and the conductive portion 221" thereabove may be removed by plasma dry etching, other suitable techniques, or any combination thereof. In some embodiments, the conductive portion 221" in the through holes 219' of the through hole structure 219 may also be removed during or after the removal of the protection layer 218. In some embodiments, the protection layer 218 may have a high etching selectivity relative to the barrier layer 216 and the second sacrificial segments 217', so that when the protection layer 218 is being removed, the barrier layer 216 and the second sacrificial segments 217' are only slightly etched or substantially unetched.

Figure 19:
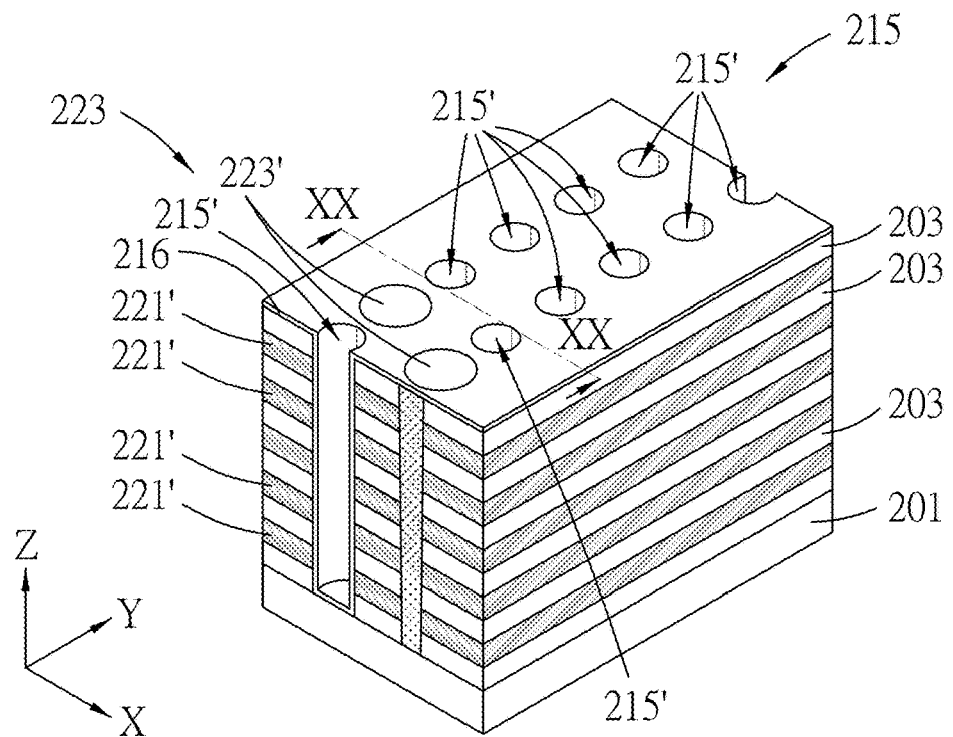
Figure 20:
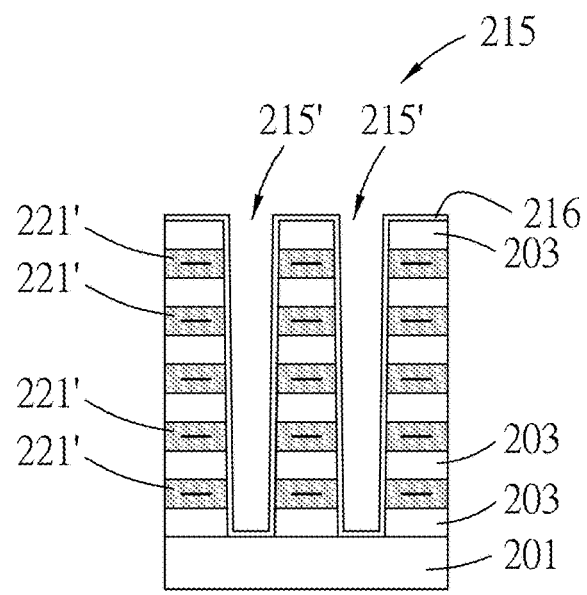

Referring to FIG. 2, in a step 122 of the method 100, the sacrificial feature is removed. Referring to FIGS. 19 and 20, where FIG. 20 is a sectional view taken from line XX-XX of FIG. 19, the sacrificial segments 217' of the sacrificial feature 217 are removed by phosphoric acid, other suitable etchants, or any combination thereof. In some embodiments, the sacrificial segments 217' may have a high etching selectivity relative to the barrier layer 216, so that when the sacrificial segments 217' is being removed, the barrier layer 216 is only slightly etched or substantially unetched.

Referring to FIG. 19, in some embodiments, before removing the sacrificial feature 217, a suitable material, such as an electrically insulating material (e.g., a dielectric material), including SiOx, SiCN, SiOC, or any combination thereof may be deposited to form a refill feature 223 filling the through hole structure 219 (see FIG. 17). In some embodiments, the refill feature 223 includes a plurality of refill segments 223' that respectively fill the through holes 219' of the through hole structure 219 (see FIG. 17).

Figure 21:
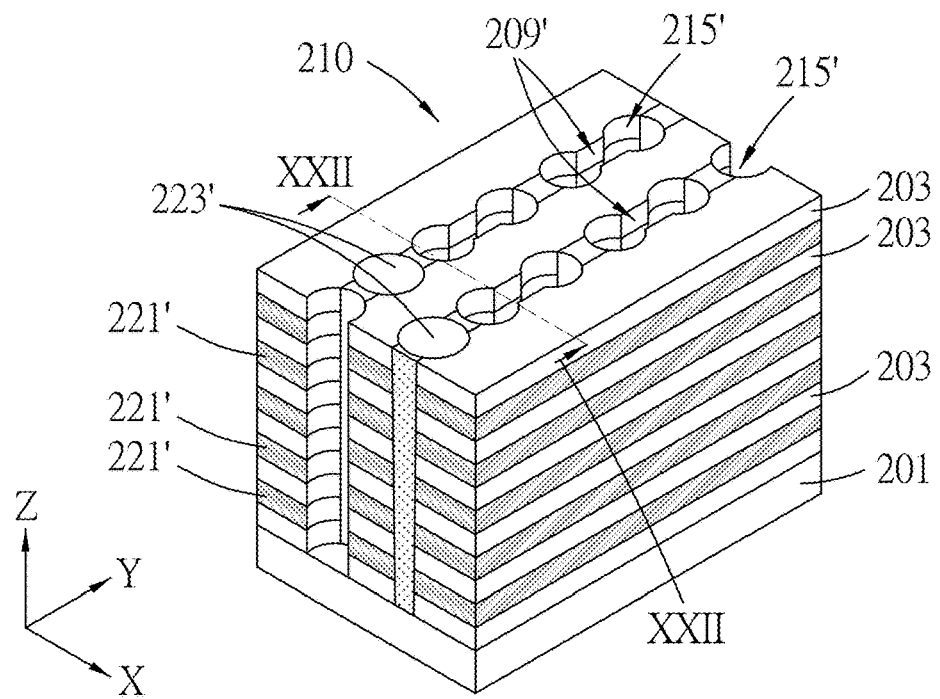
Figure 22:
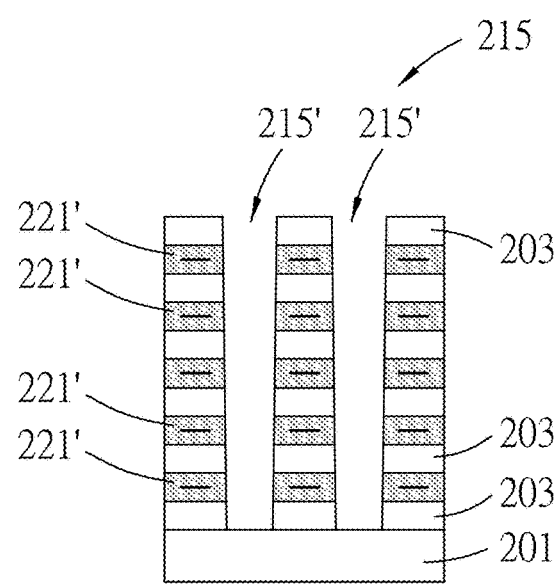

Referring to FIG. 2, in a step 124 of the method 100, the barrier layer is removed. Referring to FIGS. 21 and 22, where FIG. 22 is a sectional view taken from line XXII-XXII of FIG. 21, the barrier layer 216 may be removed by isotropic plasma etch, other suitable techniques, or any combination thereof. In some embodiments, the sacrificial portions 214' of the sacrificial member 214 are also removed to reveal the channel trenches 209', each of which is spatially communicated with corresponding two of the source/drain trenches 215'. In some embodiments, the barrier layer 216 may have a high etching selectivity relative to the dielectric layers 203 and the conductive layers 221', so that when the barrier layer 216 is being removed, the dielectric layers 203 and the conductive layers 221' are only slightly etched or substantially unetched.

Figure 23:
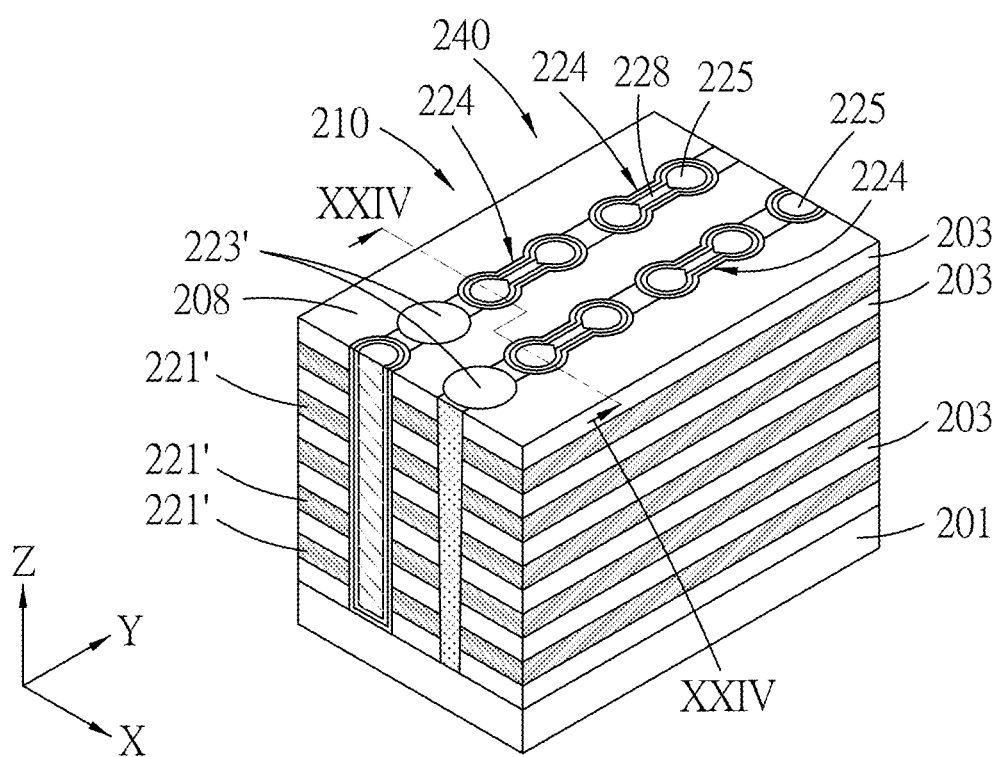
Figure 24:
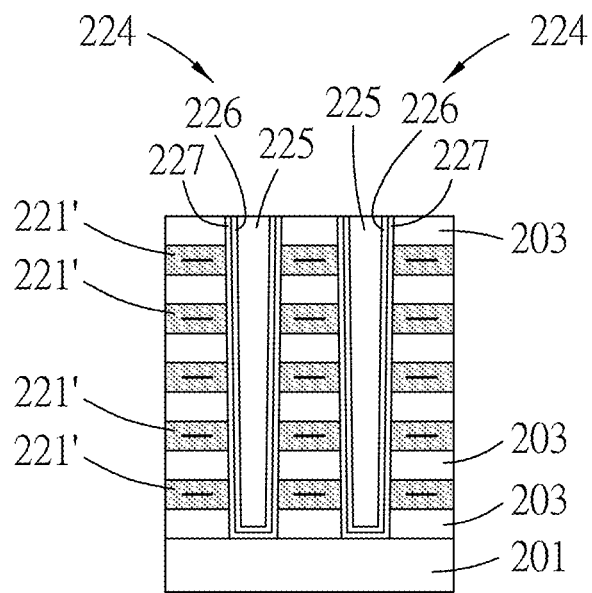

Referring to FIG. 2, in a step 126 of the method 100, a plurality of memory structures are formed. Referring to FIGS. 23 and 24, where FIG. 24 is a sectional view taken from line XXIV-XXIV of FIG. 23, each of the memory structures 224 is formed in a respective one of the channel trenches 209' and the corresponding two of the source/drain trenches 215', thereby obtaining the semiconductor memory device 240. In some embodiments, each of the memory structures 224 includes a separation segment 228, two source/drain segments 225 that are connected to opposite ends of the separation segment 228 and that are separated from each other by the separation segment 228, a channel segment 226 that surrounds the separation segment 228 and the source/drain segments 225, and a memory segment 227 that surrounds the channel segment 226.

Figure 25:
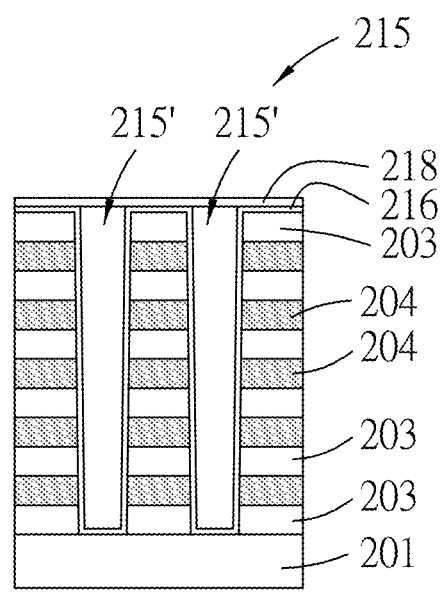
FIGS. 25 to 27 show intermediate steps of a method of forming a semiconductor memory device in accordance with some embodiments.
Figure 26:
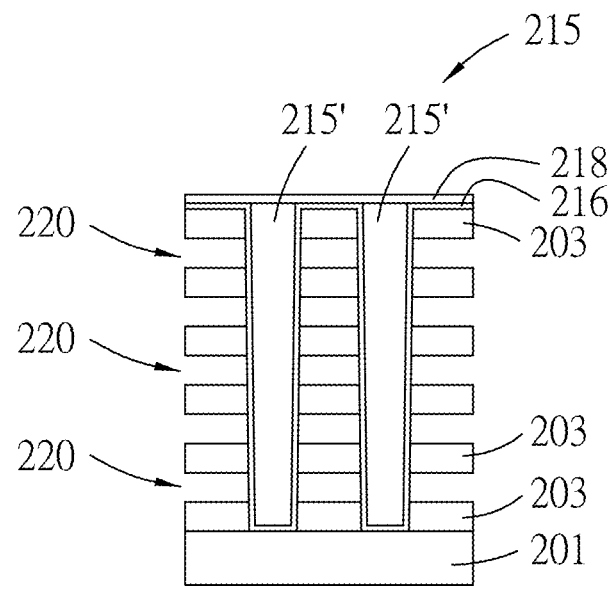
Figure 27:
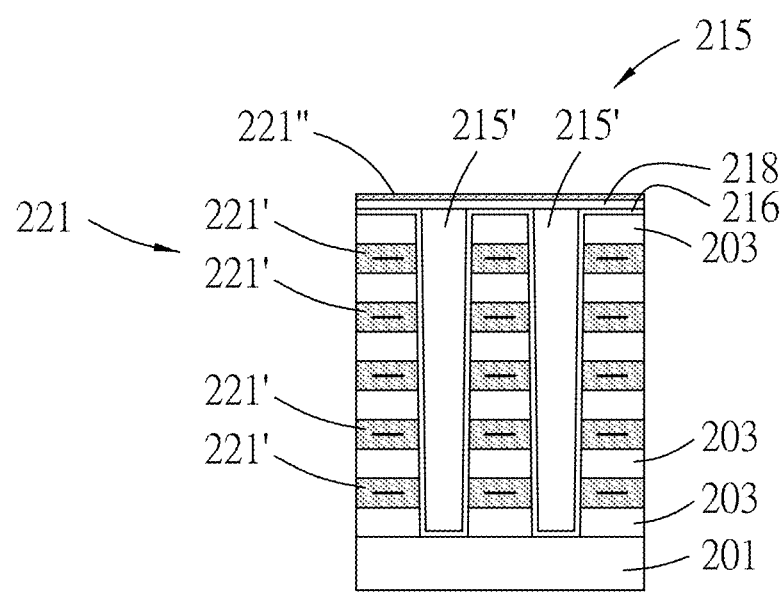

In some embodiments, FIGS. 25 to 27 are similar to FIGS. 11, 13 and 15. In FIG. 25, the sacrificial segments 217' (see FIG. 11) may be omitted, and the source/drain trenches 215' are surrounded by the barrier layer 216 and covered by the protection layer 218. Then, referring to FIG. 26, the sacrificial layers 204 shown in FIG. 25 are removed to form the spaces 220. Afterwards, referring to FIG. 27, the conductive layers 221' are formed in the spaces 220. Then the protection layer 218 and the barrier layer 216 may be removed, followed by forming the memory structures 224 (see FIGS. 23 and 24).

The embodiments of the present disclosure have some advantageous features. With the spaces 220 surrounded by the barrier layer 216 which allows the precursor material of the conductive layers 221' to be formed thereon, formation of the conductive layers 221' with a bird's beak shape may be prevented. In addition, with each of the source/drain trenches 215' being filled with the barrier layer 216 and a corresponding one of the sacrificial segments 217', the exposure of the through holes 219' after forming the conductive layers 221' can be achieved by sequentially removing the sacrificial segments 217' and the barrier layer 216. In comparison, if each of the through holes 219' is only completely filled with a single barrier layer, the barrier layer may have to be removed with a lithography-and-etching process to avoid damaging the dielectric layers 203 and/or the conductive layers 221', which may be difficult to perform for devices with small dimensions and/or through holes of high aspect ratios.

In accordance with some embodiments of the present disclosure, a method of forming a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of source/drain trenches in the stack structure; conformally forming a barrier layer in the source/drain trenches, and then filling the source/drain trenches with a plurality of sacrificial segments; forming a protection layer over the stack structure to cover the barrier layer and the sacrificial segments; removing the sacrificial layers of the stack structure to form a plurality of spaces among the dielectric layers; forming a plurality of conductive layers in the spaces; sequentially removing the protection layer, the sacrificial segments and the barrier layer; and forming a plurality of memory structures in the source/drain trenches.

In accordance with some embodiments of the present disclosure, in the step of forming the source/drain trenches, each of the source/drain trenches is defined by a bottom wall and a side wall of the stack structure. In the step of conformally forming the barrier layer, the barrier layer is formed on the bottom walls and the side walls of the stack structure.

In accordance with some embodiments of the present disclosure, in the step of conformally forming the barrier layer, the barrier layer is made by doped or undoped amorphous silicon.

In accordance with some embodiments of the present disclosure, after the removal of the sacrificial layers of the stack structure, the barrier layer is exposed from the spaces. In the step of forming the conductive layers, a precursor material is introduced into the spaces, so that the precursor material is deposited on the dielectric layers and the barrier layer exposed from the spaces to form the conductive layers.

In accordance with some embodiments of the present disclosure, the method further includes, after the step of forming the protection layer, forming a plurality of through holes penetrating the protection layer and the stack structure to expose the sacrificial layers of the stack structure. In the step of forming the conductive layers, the precursor material is introduced into the spaces through the through holes.

In accordance with some embodiments of the present disclosure, in the step of forming the protection layer, the protection layer is formed to have a thickness ranging from about 20 Å to about 1000 Å.

In accordance with some embodiments of the present disclosure, before the step of forming the source/drain trenches, forming a plurality of spaced apart sacrificial portions in the stack structure, so that, after forming the source/drain trenches, the source/drain trenches are separated from each other by the sacrificial portions. After the removal of the barrier layer, the sacrificial portions are removed.

In accordance with some embodiments of the present disclosure, the method further includes, after the step of forming the protection layer, forming a plurality of through holes penetrating the protection layer and the stack structure to expose the sacrificial layers of the stack structure.

In accordance with some embodiments of the present disclosure, a method of forming a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of spaced apart sacrificial portions in the stack structure; forming a plurality of source/drain trenches in the stack structure, the source/drain trenches being separated from each other by the sacrificial portion; conformally forming a barrier layer in the source/drain trenches and over the stack structure, and then filling the source/drain trenches with a plurality of sacrificial segments; forming a protection layer over the stack structure to cover the barrier layer and the sacrificial segments; removing the sacrificial layers of the stack structure to form a plurality of spaces among the dielectric layers; introducing a precursor material into the spaces, so that the precursor material is deposited on the dielectric layers and the barrier layer exposed from the spaces to form a plurality of conductive layers in the spaces; sequentially removing the protection layer, the sacrificial segments, the barrier layer, and the sacrificial portions; and forming a plurality of memory structures in the source/drain trenches.

In accordance with some embodiments of the present disclosure, in the step of forming the source/drain trenches, each of the source/drain trenches is defined by a bottom wall and a side wall of the stack structure. In the step of conformally forming the barrier layer, the barrier layer is formed on the bottom walls and the side walls of the stack structure.

In accordance with some embodiments of the present disclosure, in the step of conformally forming the barrier layer, the barrier layer is made by doped or undoped amorphous silicon.

In accordance with some embodiments of the present disclosure, in the step of forming the protection layer, the protection layer is formed to have a thickness ranging from about 20 Å to about 1000 Å.

In accordance with some embodiments of the present disclosure, the method further includes, after the step of forming the protection layer, forming a plurality of through holes penetrating the protection layer and the stack structure to expose the sacrificial layers of the stack structure, in the step of introducing the precursor material, the precursor material is introduced into the spaces through the through holes.

In accordance with some embodiments of the present disclosure, a method of forming a semiconductor memory device includes: forming a stack structure on a substrate, the stack structure including a plurality of dielectric layers and a plurality of sacrificial layers alternatingly stacked in a Z direction substantially perpendicular to the substrate; forming a plurality of source/drain trenches in the stack structure, each of the source/drain trenches being defined by a bottom wall and a side wall of the stack structure; conformally forming a barrier layer on the bottom walls and on the side walls defining the source/drain trenches to partially fill the source/drain trenches; forming a protection layer over the stack structure to cover the barrier layer; replacing the sacrificial layers of the stack structure with a plurality of conductive layers; removing the protection layer and the barrier layer; and forming a plurality of memory structures in the source/drain trenches.

In accordance with some embodiments of the present disclosure, the method further includes, after the step of conformally forming the barrier layer and before the step of forming the protection layer, forming a plurality of sacrificial segments to completely fill the source/drain trenches, so that, in the step of forming the protection layer, the sacrificial segments is covered by the protection layer.

In accordance with some embodiments of the present disclosure, in the step of conformally forming the barrier layer, the barrier layer is made by doped or undoped amorphous silicon.

In accordance with some embodiments of the present disclosure, the step of replacing the sacrificial layers of the stack structure with a plurality of conductive layers includes: removing the sacrificial layers of the stack structure to form a plurality of spaces among the dielectric layers; and forming the conductive layers in the spaces.

In accordance with some embodiments of the present disclosure, after the removal of the sacrificial layers of the stack structure, the barrier layer is exposed from the spaces. In the step of forming the conductive layers, a precursor material is introduced into the spaces, so that the precursor material is deposited on the dielectric layers and the barrier layer exposed from the spaces to form the conductive layers.

In accordance with some embodiments of the present disclosure, the method further includes, after the step of forming the protection layer, forming a plurality of through holes penetrating the protection layer and the stack structure to expose the sacrificial layers of the stack structure. In the step of introducing the precursor material, the precursor material is introduced into the spaces through the through holes.

In accordance with some embodiments of the present disclosure, in the step of forming the protection layer, the protection layer is formed to have a thickness ranging from about 20 Å to about 1000 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor memory device comprising:
    forming a stack structure on a substrate, the stack structure including a plurality of dielectric layers and a plurality of sacrificial layers alternatingly stacked in a Z direction substantially perpendicular to the substrate;
    forming a plurality of source/drain trenches in the stack structure;
    conformally forming a barrier layer in the source/drain trenches, and then filling the source/drain trenches with a plurality of sacrificial segments;
    forming a protection layer over the stack structure to cover the barrier layer and the sacrificial segments;
    removing the sacrificial layers of the stack structure to form a plurality of spaces among the dielectric layers;
    forming a plurality of conductive layers in the spaces;
    sequentially removing the protection layer, the sacrificial segments and the barrier layer; and
    forming a plurality of memory structures in the source/drain trenches.

2. The method as claimed in claim 1, wherein:
    in the step of forming the source/drain trenches, each of the source/drain trenches is defined by a bottom wall and a side wall of the stack structure; and
    in the step of conformally forming the barrier layer, the barrier layer is formed on the bottom walls and the side walls of the stack structure.

3. The method as claimed in claim 1, wherein, in the step of conformally forming the barrier layer, the barrier layer is made by doped or undoped amorphous silicon.

4. The method as claimed in claim 1, wherein:
    after the removal of the sacrificial layers of the stack structure, the barrier layer is exposed from the spaces; and
    in the step of forming the conductive layers, a precursor material is introduced into the spaces, so that the precursor material is deposited on the dielectric layers and the barrier layer exposed from the spaces to form the conductive layers.

5. The method as claimed in claim 4, further comprising, after the step of forming the protection layer, forming a plurality of through holes penetrating the protection layer and the stack structure to expose the sacrificial layers of the stack structure, in the step of forming the conductive layers, the precursor material is introduced into the spaces through the through holes.

6. The method as claimed in claim 1, wherein, in the step of forming the protection layer, the protection layer is formed to have a thickness ranging from about 20 Å to about 1000 Å.

7. The method as claimed in claim 1, wherein:
    before the step of forming the source/drain trenches, forming a plurality of spaced apart sacrificial portions in the stack structure, so that, after forming the source/drain trenches, the source/drain trenches are separated from each other by the sacrificial portions; and
    after the removal of the barrier layer, the sacrificial portions are removed.

8. The method as claimed in claim 1, further comprising, after the step of forming the protection layer, forming a plurality of through holes penetrating the protection layer and the stack structure to expose the sacrificial layers of the stack structure.

9. A method of forming a semiconductor memory device comprising:
    forming a stack structure on a substrate, the stack structure including a plurality of dielectric layers and a plurality of sacrificial layers alternatingly stacked in a Z direction substantially perpendicular to the substrate;
    forming a plurality of spaced apart sacrificial portions in the stack structure;
    forming a plurality of source/drain trenches in the stack structure, the source/drain trenches being separated from each other by the sacrificial portion;
    conformally forming a barrier layer in the source/drain trenches and over the stack structure, and then filling the source/drain trenches with a plurality of sacrificial segments;
    forming a protection layer over the stack structure to cover the barrier layer and the sacrificial segments;
    removing the sacrificial layers of the stack structure to form a plurality of spaces among the dielectric layers;
    introducing a precursor material into the spaces, so that the precursor material is deposited on the dielectric layers and the barrier layer exposed from the spaces to form a plurality of conductive layers in the spaces;
    sequentially removing the protection layer, the sacrificial segments, the barrier layer, and the sacrificial portions; and
    forming a plurality of memory structures in the source/drain trenches.

10. The method as claimed in claim 9, wherein:
    in the step of forming the source/drain trenches, each of the source/drain trenches is defined by a bottom wall and a side wall of the stack structure; and
    in the step of conformally forming the barrier layer, the barrier layer is formed on the bottom walls and the side walls of the stack structure.

11. The method as claimed in claim 9, wherein, in the step of conformally forming the barrier layer, the barrier layer is made by doped or undoped amorphous silicon.

12. The method as claimed in claim 9, wherein, in the step of forming the protection layer, the protection layer is formed to have a thickness ranging from about 20 Å to about 1000 Å.

13. The method as claimed in claim 9, further comprising, after the step of forming the protection layer, forming a plurality of through holes penetrating the protection layer and the stack structure to expose the sacrificial layers of the stack structure, in the step of introducing the precursor material, the precursor material is introduced into the spaces through the through holes.

14. A method of forming a semiconductor memory device comprising:
    forming a stack structure on a substrate, the stack structure including a plurality of dielectric layers and a plurality of sacrificial layers alternatingly stacked in a Z direction substantially perpendicular to the substrate;
    forming a plurality of source/drain trenches in the stack structure, each of the source/drain trenches being defined by a bottom wall and a side wall of the stack structure;
    conformally forming a barrier layer on the bottom walls and on the side walls defining the source/drain trenches to partially fill the source/drain trenches;
    forming a protection layer over the stack structure to cover the barrier layer;
    replacing the sacrificial layers of the stack structure with a plurality of conductive layers;
    removing the protection layer and the barrier layer; and
    forming a plurality of memory structures in the source/drain trenches.

15. The method as claimed in claim 14, further comprising, after the step of conformally forming the barrier layer and before the step of forming the protection layer, forming a plurality of sacrificial segments to completely fill the source/drain trenches, so that, in the step of forming the protection layer, the sacrificial segments is covered by the protection layer.

16. The method as claimed in claim 14, wherein, in the step of conformally forming the barrier layer, the barrier layer is made by doped or undoped amorphous silicon.

17. The method as claimed in claim 14, wherein the step of replacing the sacrificial layers of the stack structure with a plurality of conductive layers includes:
    removing the sacrificial layers of the stack structure to form a plurality of spaces among the dielectric layers; and
    forming the conductive layers in the spaces.

18. The method as claimed in claim 17, wherein:
    after the removal of the sacrificial layers of the stack structure, the barrier layer is exposed from the spaces; and
    in the step of forming the conductive layers, a precursor material is introduced into the spaces, so that the precursor material is deposited on the dielectric layers and the barrier layer exposed from the spaces to form the conductive layers.

19. The method as claimed in claim 14, further comprising, after the step of forming the protection layer, forming a plurality of through holes penetrating the protection layer and the stack structure to expose the sacrificial layers of the stack structure, in the step of introducing the precursor material, the precursor material is introduced into the spaces through the through holes.

20. The method as claimed in claim 14, wherein, in the step of forming the protection layer, the protection layer is formed to have a thickness ranging from about 20 Å to about 1000 Å.

* * * * *